United States Patent [19]

Sperry et al.

[11] Patent Number: 4,824,765

[45] Date of Patent: Apr. 25, 1989

[54] WATER-SOLUBLE PHOTOINITIATORS

[76] Inventors: John A. Sperry, 41 Norman Avenue, Abingdon, Oxon, OX14 2HJ; Ross A. Balfour, 36 Mallard Way, Grove, Wantage, Oxon, both of England

[21] Appl. No.: 917,465

[22] Filed: Oct. 10, 1986

[30] Foreign Application Priority Data

Oct. 10, 1985 [GB] United Kingdom ............... 8525027

[51] Int. Cl.$^4$ .......................... G03C 5/00; G03C 1/68
[52] U.S. Cl. ..................... 430/281; 430/919; 430/921; 430/923; 522/34; 522/55; 522/57; 522/65; 522/66; 522/68
[58] Field of Search ............ 522/34, 55, 57, 65, 522/66, 68; 430/919, 921, 923, 281

[56] References Cited

U.S. PATENT DOCUMENTS

| 3,600,436 | 8/1971 | Kuhn et al. | ............ 260/520 |
| 4,290,870 | 9/1981 | Kondoh et al. | ............ 522/34 X |
| 4,576,975 | 3/1986 | Reilly, Jr. | ............ 430/919 X |

FOREIGN PATENT DOCUMENTS

| 1342971 | 1/1974 | United Kingdom . |
| 1380808 | 1/1975 | United Kingdom . |
| 2108487 | 5/1983 | United Kingdom . |

*Primary Examiner*—Paul R. Michl
*Assistant Examiner*—Cynthia Hamilton
*Attorney, Agent, or Firm*—Panitch Schwarze Jacobs & Nadel

[57] ABSTRACT

Substituted dibenzalketones useful as water-soluble photoinitiators have the formula:

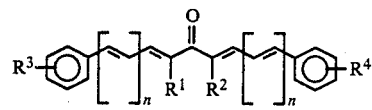

wherein $R^1$ and $R^2$ are 4, alkyl or, taken together, an aliphatic ring, $n=0$ or an integer and $R^3$ and $R^4$ either are both water-solubilizing groups (a) —X(CH$_2$)$_m$N$^+$R$^5$$_3$, (b) —X(CH$_2$)$_m$COO$^-$M or (c) —X(CH$_2$)$_m$SO$^-$$_3$M$_5$ or one is such a group and the other is (d) a group —NR$^5$$_2$, X is —CH$_2$—, —O— or —S—, $R^5$ is an alkyl group, M is H$^+$ or a metal cation and $m=0$. Such a photoinitiator compound is associated with a polymerizable compound in an aqueous photopolymerizable composition.

6 Claims, No Drawings

WATER-SOLUBLE PHOTOINITIATORS

This invention relates to photopolymerisable compositions which contain a photopolymerisation initiator, a polymerisable compound having unsaturated bonds and a binder. In particular, it relates to those compositions capable of being processed by the use of water only, after exposure to actinic light.

The photopolymerisation of unsaturated compounds is a well-known technique and is widely used in the preparation of such items as litho and letterpress printing-plates, screen printing stencils, etch resists, UV-cured inks and overcoating lacquers, and abrasion-resistant and mar-resistant coatings on films.

Widely used in these applications are the chemical entities containing double-bonds, such as those containing vinyl or acrylate groups. The polymerisation of these compounds is caused by free radicals, produced by irradiation of suitable photoinitiators with actinic light. Photoinitiators commonly used for these purposes include benzil, benzoin, benzoin ethers, benzophenone and substituted benzophenones, such as Michler's ketone, thioxanthone and substituted thioxanthones, and acetophenone and substituted acetophenones. In applications where a photographic image is to be reproduced by the process, that is to say the photosensitive coating is exposed to actinic light through a photographic positive or negative, thereby causing hardening by polymerisation only of those areas struck by the light, the exposure step is necessarily followed by a development step. This usually involves treatment by a suitable solvent to remove those areas of the coating shielded from the light during exposure and therefore not so hardened. There is a considerable and growing interest in photopolymerisable systems of this general kind which may be developed after exposure simply by the application of water or solutions of aqueous alkalies, thereby avoiding the use of flammable or noxious solvents and also reducing the cost of processing.

In order to optimise the efficiency of the photopolymerisation step, it is desirable for the photoinitiator, the unsaturated compound and the binder all to be soluble in water. Unfortunately, the commercially-available photoinitiators listed above are not water-soluble. Attempts to use them, by techniques such as the dispersion of a hydrophobic monomer-photoinitiator mixture in an aqueous colloid solution before coating, are not very successful; the colloid binder does not participate adequately in the subsequent photoreaction. This results in low efficiencies of hardening, requiring extended exposure times and giving images of poor quality. A number of water-soluble derivatives of the conventional photoinitiators listed above have been described, such as sodium-4-(sulphomethyl)benzophenone, sodium-4-sulphomethylbenzil and sodium-2-(3-sulphopropoxy)thioxanthone, described in GB-A-2,108,487. These are not very accessible, generally requiring a complex synthetic route, and additionally have the disadvantage in their absorption properties which is described below.

As well as water-solubility, the light absorption properties of the photoinitiators are very important. It is necessary for the absorption of the photoinitiator to match as closely as possible the emission of the activating light, in order to optimise the efficiency of the photoreaction. The actinic light-source employed are generally of the mercury vapour type or, more usually, mercury vapour lamps doped with metal halides.

Mercury vapour lamps have a strong emission at 365 nm; the effect of using metal halides to dope the lamps is to increase the number of spectral lines and, in particular, to increase the proportion of light emitted at longer wavelengths. A strong emission of light having wavelengths around 400 to 420 nm is common with many lamps. This is desirable for several reasons. The longer wavelength light is less harmful phsiologically, in the case of accidental exposure, light of short wavelength is absorbed by the glass of the exposure device or the film base upon which the light-sensitive emulsion often has been coated, and light of longer wavelength has better penetrating power, allowing thick resists to be adequately exposed. In addition, there is an increasing interest in the use of lasers to expose photoresist materials, particularly in the microelectronics industry. Lasers generally have very specific emission wavelengths in the visible region of the spectrum. As the efficiency of the photopolymerisation reaction depends upon the amount of light absorbed by the photoinitiator, it is very desirable to be able to mainpulate the structure of the absorbing molecule so as to more nearly match the emission of the light source which it is proposed to use for a particular application. For example, it is desirable to produce a photoinitaitor having a broad band of absorption around 400 nm for general use, e.g. for use with metal-halide-doped mercury vapour lamps, or with a more narrow but specific peak absorption for use with lasers. None of the water-soluble photoinitiators described above are capable of such manipulation.

According to one aspect of this invention, an aqueous photopolymerisable composition is provided, comprising (i) a polymerisable compound having at least one ethylenically-unsaturated bond and (ii) a photopolymerisation initiator, characterised in that the photopolymerisation initiator is a compound represented by the general formula:

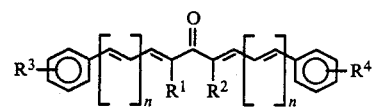

wherein $R^1$ and $R^2$ are the same or different and each is a hydrogen atom or an alkyl group or, taken together, $R^1$ and $R^2$ are an aliphatic ring, $n=0$ or an integer and $R^3$ and $R^4$ are the same or different and each is a water-solubilising group selected from:
  (a) $-X(CH_2)_m N^+ R^5_3$,
  (b) $-X(CH_2)_m COO^- M$ or
  (c) $-X(CH_2)_m SO^-_3 M$, or
  (d) a group $-NH^5_2$,
wherein X represents $-CH_2-$, $-O-$ or $-S-$, $R^5$ is an alkyl group, M is $H^{30}$ or a metal cation and $m=0$ or an integer from 1 to 6 and wherein, if one of $R^3$ and $R^4$ is $-NR^5_2$, the other of $R^3$ and $R^4$ is selected from the water-solubilising groups (a), (b) and (c).

The water-soluble photoinitiators of the present invention have the following formula:

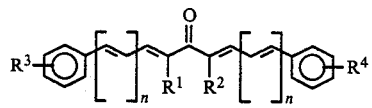

wherein $R^1$ and $R^2$ are the same or different and each is a hydrogen atom or an alkyl group or, taken together, $R^1$ and $R^2$ are an aliphatic ring, $n=0$ or an integer and $R^3$ and $R^4$ are the same or different and each is a group selected from:

(a) $-X(CH_2)_m N^+ R^5_3$,
(b) $-X(CH_2)_m COO^- M$ or
(c) $-X(CH_2)_m SO^-_3 M$, or
(d) a group $-NR^5_2$, wherein X represents $-CH_2-$, $-O-$ or $-S-$, $R^5$ is an alkyl group, M is $H^+$ or a metal cation and $m=0$ or an integer from 1 to 6, wherein, when $R^1=R^2=$hydrogen and $n=0$, $R^3$ and $R^4$ are not both ortho-$(CH_2,-CH_2COOH)$ or both para-$(O-CH_2COOH)$ and, when one of $R^3$ and $R^4$ is (d), the other of $R^3$ and $R^4$ is selected from (a), (b) and (c), and metal salts of such compounds.

Thus, in the above general fromula, when $R^3$ is a water-solubilising group selected from (a), (b) or (c), then $R^4$ may be $-NR^5_2$ or (a), (b) or (c) and, when $R^4$ is a water-solubilising group selected from (a), (b) or (c), then $R^3$ may be $-NR^5_2$ or (a), (b) or (c).

These new photoinitiators are easy to manufacture, in most cases from readily-available starting materials. The absorption properties can be varied by varying the length of the conjugated chain ("n") and can be made to match the emission of the normal actinic light sources; by increasing the chain-length, the λ max changes to longer wavelengths right through the visible spectrum.

The compounds have a high photoefficiency and may be used in amounts of 0.1%–10% by weight based on the polymerisable ethylenically-unsaturated compounds. The unsaturated compounds which can be used in conjunction with the photoinitiators include acrylamide, N-methylolacrylamide, N-vinyl-pyrrolidone, diacetone-acrylamide, methylenebis-acrylamide and bis-acrylamidoacetic acid. Suitable water-soluble binders include polyvinyl alcohol, gelatin, casein, hydroxyethyl cellulose, hydroxypropyl cellulose, polyvinylpyrrolidone and carboxy-methyl cellulose.

Pigments may also be included in order to render the final image visible, and/or fillers such as kaolin, silica, titanium dioxide, or dispersions such as polyvinyl acetate dispersions and humectants or other plasticisers, to increase the flexiblity of a coated layer.

The actinic light may be from any source including natural light, but the initiators are particularly suitable for doped mercury vapour lamps or laser light sources.

Resist images formed by using the systems described can be used in any photographic or photomechanical process where a resist or stencil or relief image is required, for example etching resists for printing plates, name plates, dials and circuit patterns, or for preparing stencils for silk screen printing. The initiators may also be used in water containing printing inks capable of being cured by irradiation to actinic light.

The compounds of the invention are easily prepared by the base-catalysed condensation of two moles of substituted benzaldehyde with one mole of ketone. In the following, Examples 1 to 5 illustrate the preparation of compounds of the invention and Example 6 illustrates use of compounds and compositions of the invention in comparison with well-known photoinitiators.

EXAMPLE 1

Preparation of 2,2'-dicarboxymethoxydibenzalacetone disodium salt, (I)

2-Formylphenoxyacetic acid (18 g, 0.1 m) was dissolved in 90 g of warm ethanol and sodium hydroxide (6 g, 0.15 m) in 10 g water was added. Acetone (3 g, 0.05 m) was added with stirring. After 5 minutes, the product started to precipitate; the reaction mixture was allowed to stand for 4 hours, the product filtered and washed at the pump with ethanol. Yield 90%. The product I ($R^1=R^2=H$, $n=0$, $X=0$, $m=1$, $M=Na$ in the general formula) has the structure:

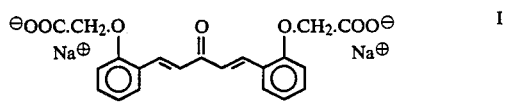

EXAMPLE 2

Preparation of 2,2'-dicarboxymethoxydibenzalcyclohexanone disodium salt, (II)

When cyclohexanone (5 g, 0.05 m) was used in place of acetone, in operating as described in Example 1, the corresponding dibenzalcyclohexanone ($R^1$ and $R^2$ taken together $=-(CH_2)_4-$) was obtained in 80% yield.

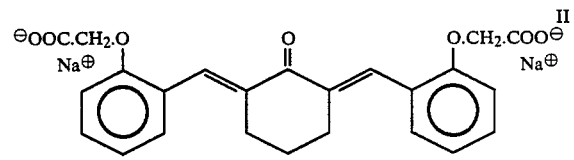

EXAMPLE 3

Preparation of 4,4'-dicarboxymethoxydibenzalcyclohexanone disodium salt, (III)

4-Formylphenoxyacetic acid (18 g, 0.1 m) was treated with cyclohexanone (5 g, 0.05 m) in the presence of sodium hydroxide (6 g, 0.15 m) in 90 g acetone and 10 g water. After 5 minutes, the product (III) had precipitated, was filtered and washed with ethanol. Yield 90%.

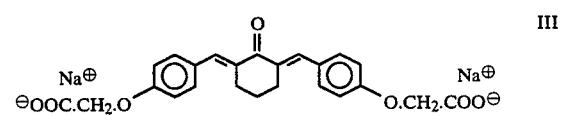

EXAMPLE 4

Preparation of 4-dimethylamino-4'-carboxymethoxydibenzalacetone sodium salt, (IV)

4-Formylphenoxyacetic acid (1.8 g, 0.01 m) was treated with acetone (6 g, 0.1 m–10 mole excess) in the presence of sodium hydroxide (0.6 g) in 10 g of ethanol and 5 g of water. Carboxymethoxybenzylideneacetone sodium salt precipitated and was filtered off. The product was dissolved in methanol (10 g) containing dimethylaminobenzaldehyde (1.5 g, 0.01 m) and sodium hydroxide (0.2 g) in 5 g water was added. The mixture was heated under reflux for 3 hours and then allowed to cool. The reaction mixture was allowed to stand overnight, the product crystallised, was filtered off and washed with a little methanol. Yield 30%.

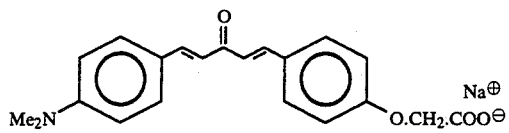

IV

EXAMPLE 5

Preparation of 4,4'-disulphoxyethoxydibenzalacetone disodium salt, (V)

4-Hydroxybenzaldehyde (2.4 g, 0.02 m) was dissolved in ethanol (5 g) and sodium hydroxide (0.8 g) in 5 g of water was added. The sodium salt of 4-hydroxybenzaldehyde crystallised on standing; this was collected by filtration and washed with ethanol. This sodium salt, together with sodium bromoethanesulphonate (4.2 g, 0.05 m) was dissolved in methanol (20 g). The mixture was heated to boiling and the methanol gradually replaced by Dowanol* PM. After 10 minutes, sodium bromide was fully precipitated and the solution had lost its deep red colour. Filtration to remove the sodium bromide, followed by cooling of the filtrate, gave sodium 4-formulphenoxy-ethanesulphonate. This was filtered, washed and dried and then dissolved in hot ethanol (10 g). Sodium hydroxide (0.2 g) in 5 g water was added, followed by acetone (0.6 g, 0.01 m). The mixture was heated under reflux for 20 minutes, then allowed to cool. On standing overnight, the product (V) crystallised, was collected by filtration, washed with ethanol and dried. Yield 20%.

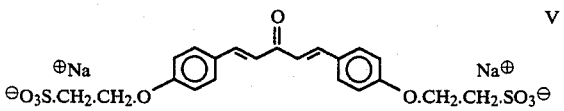

V

*"Dowanol" is a Registered Trade Mark and identifies propyleneglycol methyl ethers manufactured by Dow Chemicals.

The following table gives details of the physical and chemical characteristics of the compounds prepared as described in Examples 1 to 5.

| Compound | Appearance as Sodium Salt | Solubility in water (g/l) at 20° C. | Melting Point °C. | Max nm | Max 1 mol-'cm' |
|---|---|---|---|---|---|
| I | Yellow/orange powder | 190 | 204–6 | 372 | 17,900 |
| II | Yellow powder | 150 | 161–2 | 357 | 17,400 |
| III | Yellow powder | 1 | 260* | 379 | 23,800 |
| IV | Orange crystals | 40 | 280* | 370 +  430 | 16,200 + 17,300 |
| V | Yellow crystals | 100 | — | 378 | 16,600 |

*with decomposition

EXAMPLE 6

(a) The ability of the compounds of Examples 1 to 5 to initiate free radical photopolymerisation was tested in a 'std' formulation. In addition, a composition of the invention based on a known compound, 4,4'-dicarboxymethyoxydibenzalacetone disodium salt, VI, was also tested. The photosensitive nature of this compound, VI, structure below, has not been previously reported. As a comparison, the following commercially-available thioxanthone photoinitiators were included.

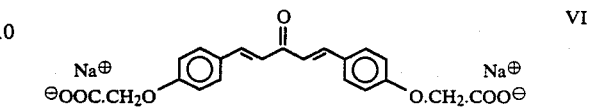

VI

Quanatacure QTX

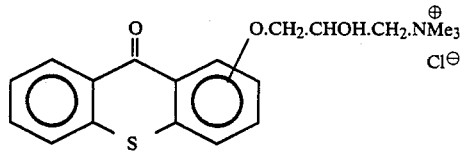

"Quantacure" is a Registered Trade Mark of Ward Blenkinsop & Co. Ltd.
Sulphopropoxythioanthone Sodium Salt—WB4718

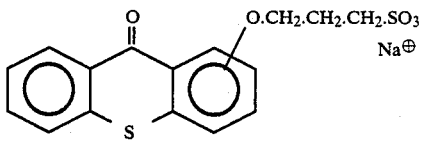

(b) 'Std' formulation.
Film former: 15% aqueous 26/88 Polyvinylalcohol: 100 g
Monomer: Rahn water-soluble difunctional oligomer 85-578/79: 7 g
Pigment: Unisperse Voilet: 0.2 g
Synergist: Triethanolamine: 1.5 g
Photoinitiator: 0.15 g
Coatings were produced on polyester base, which had been pretreated with a gelatin subcoat, by metering with a 200" thou (5 mm) wire-wound bar; the dry coatings were 40 μm in thickness.

(c) Exposures were given by a 5 kw metal-halide-doped mercury vapour lamp to a Kodak 0.15 increment stepwedge and an Autotype exposure calculator. Exposure dose: 30 mJ/cm², measured at 365 nm.

The following number of steps were visible of the Kodak stepwedge after development with running water.

| Photoinitiator | Number of Steps Visible |
|---|---|
| I | 15 |
| II | 0 |
| III | 4 |
| IV | 8 |
| V | 16 |
| VI | 17 |
| QTX | 12 |
| WB4718 | 8 |

We claim:
1. An aqueous photopolymerisable composition, comprising (i) a polymerisable compound having at least one ethylenically-unsaturated bond and (ii) a photopolyerisation initiator represented by the general formula:

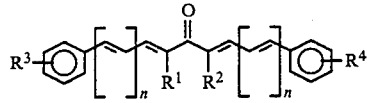

wherein $R^1$ and $R^2$ are the same or different and each is a hydrogen atom or an alkyl group or, taken together, $R^1$ and $R^2$ are an aliphatic ring, n=0 or an integer, $R^3$ is a water-solubilising group:
(a) $-X(CH_2)_mN^+R^5_3$,
(b) $-X(CH_2)_mCOO^-M$ or
(c) $-X(CH_2)_mSO^-_3M$, and $R^4$ is any one of the water-solubilising groups of $R^3$ or $-NR^5_2$, wherein X represents $-CH_2-$, $-O-$ or $-S-$, $R^5$ is an alkyl group, M is $H^+$ or a metal cation and m=0 or an integer from 1 to 6, and wherein $R^1$ and $R^2$ do not together form an aliphatic ring $-((CH_2)_4)$ when $R^3$ and $R^4$ are both group (b) in the ortho positions and have the formula $-OCH_2COOM$.

2. An aqueous photopolymerisable composition according to claim 1, wherein the photopolymerisation initiator is 2,2'-dicarboxymethoxydibenzalacetone, 4,4'-dicarboxymethoxydibenzalacetone, 4,4'-dicarboxymethoxydibenzalcyclohexanone, 4-dimethylamino-4'-carboxymethoxydibenzalacetone, 4,4'-disulphoxymethoxydibenzalacetone or their salts.

3. A light-sensitive composition for use in the production of polymeric resist images, which comprises:
(a) an ethylenically-unsaturated monomer, dissolved or dispersed in:
(b) a water-soluble colloid and which also contains:
(c) a photoinitiator,
characterised in that the photoinitiator (c) is a compound of the formula defined in claim 1.

4. A sheet material for the production of polymeric resist images, which comprises a support carrying a coating of a light-sensitive composition as defined in claim 3.

5. A process of initiating polymerisation of a polymerisable compound having at least one ethylenically-unsaturated bond by preparing an aqueous composition comprised of the compound and a water-soluble photopolymerisation initiator compound represented by the formula:

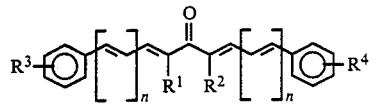

wherein $R^1$ and $R^2$ are the same or different and each is a hydrogen atom or an alkyl group or, taken together, $R^1$ and $R^2$ are an aliphatic ring, n=0 or an integer, $R^3$ is a water-solubilising group:
(a) $-X(CH_2)_mN^+R^5_3$,
(b) $-X(CH_2)_mCOO^-M$ or
(c) $-X(CH_2)_mSO^-_3M$, and $R^4$ is any one of the water-solubilising groups of $R^3$ or $-NR^5_2$, wherein X represents $-CH_2-$, $-O-$ or $-S-$, $R^5$ is an alkyl group, M is $H^+$ or a metal cation and M=0 or an integer from 1 to 6, and wherein $R^1$ and $R^2$ do not together form an aliphatic ring $-(CH_2)_4)$ when $R^3$ and $R^4$ are both group (b) in the ortho positions and have the formula $-OCH_{12}COOM$, and thereafter exposing the composition to actinic light.

6. A process for initiating polymerisation of a polymerisable compound having at least one ethylenically-unsaturated bond by preparing an aqueous composition comprised of the compound and a water-soluble photopolymerisation initiator compound represented by the formula:

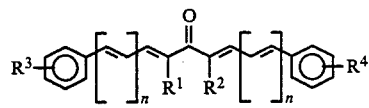

wherein $R^1$ and $R^2$ are the same or different and each is a hydrogen atom or an alkyl group or, taken together, $R^1$ and $R^2$ are an aliphatic ring, N=0 or an integer, $R^3$ is a group:
(a) $-X(CH_2)_mN^+R^5_3$,
(b) $-X(CH_2)_mCOO^-M$ or
(c) $-X(CH_2)_mSO^-_3M$, and $R^4$ each is a group $-NR^5_2$ wherein X represents $-CH_2-$, $-O-$ or $-S-$, $R^5$ is an alkyl group, M is $H^+$ or a metal cation and M=an integer from 1 to 6, wherein when $R^1=R^2=$hydrogen and n=0, $R^3$ and $R^4$ are not both ortho-$(O-CH_2COOH)$ or both para-$(O-CH_2COOH)$ and when $R^4$ is $-NR^5_2$, $R^3$ is (a), (b) or (c), or metal salts of such compounds, and thereafter exposing the composition to actinic light.

* * * * *